United States Patent [19]

Edmonston et al.

[11] Patent Number: 5,242,477
[45] Date of Patent: Sep. 7, 1993

[54] APPARATUS FOR COATING OPTICAL FIBERS

[75] Inventors: Don R. Edmonston, Atlanta, Ga.; Richard G. Huff, Basking Ridge, N.J.

[73] Assignee: AT&T Bell Laboratories, Murray Hill, N.J.

[21] Appl. No.: 877,691

[22] Filed: May 1, 1992

Related U.S. Application Data

[60] Division of Ser. No. 729,785, Jul. 10, 1991, Pat. No. 5,147,432, which is a continuation of Ser. No. 424,774, Oct. 19, 1989, abandoned.

[51] Int. Cl.$^5$ .................... C03B 37/027; C03C 25/02
[52] U.S. Cl. ...................................... 65/11.1; 65/3.11; 65/3.43; 65/13; 118/118; 118/719
[58] Field of Search ............... 65/2, 3.11, 3.12, 3.43, 65/13, 32.4; 118/718, 719

[56] References Cited

U.S. PATENT DOCUMENTS

| | | | |
|---|---|---|---|
| 4,173,393 | 11/1979 | Maurer | 350/96.34 |
| 4,183,621 | 1/1980 | Kao et al. | 350/96.30 |
| 4,210,431 | 7/1980 | Bachman et al. | 65/3 |
| 4,227,907 | 10/1980 | Merritt | 65/3 |
| 4,306,896 | 12/1981 | Maklad | . |
| 4,321,073 | 3/1982 | Blair | 65/3.31 |
| 4,402,993 | 9/1983 | Aisenberg et al. | 427/38 |
| 4,407,561 | 10/1983 | Wysocki | 350/96.3 |
| 4,418,984 | 12/1983 | Wysocki et al. | 350/96.33 |
| 4,504,112 | 3/1985 | Gould et al. | 350/96.23 |
| 4,512,629 | 4/1985 | Hanson et al. | 350/96.30 |
| 4,514,205 | 4/1985 | Darcangelo | 65/13 |
| 4,518,628 | 5/1985 | Biswas et al. | 427/55 |
| 4,530,750 | 7/1985 | Aisenberg et al. | 204/298 |
| 4,575,463 | 3/1986 | Biswas et al. | 427/163 |
| 4,608,276 | 8/1986 | Lamb | 65/3.11 |
| 4,651,917 | 3/1987 | Gould et al. | 228/173.5 |
| 4,659,354 | 4/1987 | Roba | 65/3.12 |
| 4,812,150 | 3/1989 | Scott | 65/3.11 |
| 4,857,095 | 8/1989 | Brown | 65/60.3 |
| 4,857,097 | 8/1989 | Berry | 65/60.52 |
| 4,863,760 | 9/1987 | Schantz | 65/60.8 |
| 4,874,222 | 10/1989 | Vacha et al. | 350/96.34 |

FOREIGN PATENT DOCUMENTS

| | | |
|---|---|---|
| 308143 | 3/1989 | European Pat. Off. . |
| 2493302 | 5/1982 | France . |
| 56-041860 | 4/1981 | Japan . |
| 57-209844 | 12/1982 | Japan . |
| 57-209845 | 12/1982 | Japan . |
| 1134133 | 11/1968 | United Kingdom . |
| 2156858 | 10/1985 | United Kingdom . |

OTHER PUBLICATIONS

Charles, R. J., "Static Fatigue of Glass. II", *Journal of Applied Physics*, vol. 29, No. 11 (Nov. 1958) pp. 1554–1560.

Chudhuri, R., et al., "Hermetic Coating on Optical Fibers", in: Paul, D. K., *Reliability Considerations In Fiber Optic Applications*, Proceedings of SPIE 717, pp. 27–32 (1987), ISBM 0-89252-752-8.

Maurer, R. D., "Fiber Coating and Strength", Proceedings of Optical Fiber Conference 1982 Paper No. WCC1, p. 38.

Shantz, C. A., et al., "Properties of Silicon Oxynitride Coated Fatigue-Resistant Fibers," Proceedings of Optical Fiber Conference 1982 Paper No. WCC2, p. 38.

(List continued on next page.)

*Primary Examiner*—Robert L. Lindsay
*Attorney, Agent, or Firm*—Edward W. Somers; Donald E. Hayes, Jr.

[57] ABSTRACT

An optical fiber (24), destined to receive a hermetic coating (32), is moved through a hermetic coating apparatus (30) wherein the fiber, entering the hermetic coating apparatus as a predetermined temperature, is caused to be engaged by a reactive gas. The reactive gas, reacting with the heated fiber, is effective to cause a layer of a hermetic material to be deposited adjacent to the outer surface of the fiber. A cross-flow purge gas is effective to prevent a resultant accumulation of a soot comprising reactive components of the reactive gas adjacent to portions of the hermetic coating apparatus which become heated by the fiber. Failure to prevent the accumulation of the soot may lead to fiber abrasions and reduced fiber strength.

7 Claims, 2 Drawing Sheets

OTHER PUBLICATIONS

Tinge, L., Optical Fiber Communications, vol. 1, Chapter 4, "Fiber Drawing and Strength Properties".

Frank V. DiMarcello, et al. U.S. patent application Ser. No. 098,253 filed Sep. 18, 1987.

Wysocki, J. A., et al., "Evidence of Static Fatigue of Silica In Hermetic Environments," Proceedings of Optical Fiber Conference 1982, Paper No. WCC3.

Stein, M. L., et al., "Ion Plasma Deposition of Hermetic Coatings For Optical Fibers," Physics of Fiber Optics, Advances in Ceramics, vol. E, American Ceramics Society (May 1981), pp. 124–133.

APPARATUS FOR COATING OPTICAL FIBERS

This is a division of application Ser. No. 07/729,785 filed Jul. 10, 1991 now U.S. Pat. No. 5,147,432 which is a continuation application of U.S. Ser. No. 07/424,774 filed Oct. 19, 1989 abandoned.

This invention relates to methods of and apparatus for coating optical fiber. More particularly, it relates to methods of and apparatus for the application of a hermetic coating adjacent to the outer surface of drawn optical fiber.

BACKGROUND OF THE INVENTION

During a process of manufacturing a glass optical fiber, a glass fiber is drawn from a preform and then coated with one or more coating materials. The coating materials include, for example, polymeric compositions and are applied by one or more coating applicators. The function of the fiber coating is to protect the surface of the glass optical fiber from mechanical scratches and abrasions which the optical fiber may experience during subsequent handling and use. The coating or coatings also influence the optical fiber's optical characteristics in response to external mechanical forces and environmental temperature.

Polymeric coatings are effective to prevent mechanical damage to the glass fiber surface they are meant to protect, however, diffusion of water vapor, hydroxyl ions, and hydrogen through the polymeric coatings pose additional threats to the strength, mechanical integrity and optical performance of the optical fiber.

Mechanical failure of the optical fiber may occur through a glass fiber failure mechanism referred to as stress corrosion. In an outer surface of a glass body, there exist surface imperfections resulting from mechanical damage or flawed silica bonds, for example. These imperfections, which are called microcracks, act as stress concentrators and thus may cause failure to occur preferentially at these locations when the fiber is subjected to tensile stresses. As stress is increased to a certain critical level the fiber will fail catastrophically at the crack site. Normally, these cracks will not grow under the influence of stress alone. In the presence of contaminates, hydroxyl ions, for example (the source of which may be water vapor), these cracks tend to grow at predictable rates when subjected to tensile loading. This stress corrosion is the result of the incorporation of the hydroxyl ions into the silica matrix of the optical fiber. Fiber failure may occur at stress levels significantly below an otherwise higher level due to the fact that the microcracks slowly but steadily reduce the area over which the tensile loads are resisted.

The presence of hydrogen adjacent to the optical fiber can also result in the diffusion of hydrogen through the polymer coatings and into the fiber core. Hydrogen which has diffused into the core of the fiber may react with core glass matrix defects, the effect of which is increased optical loss in the fiber.

Stress corrosion and hydrogen absorption can be prevented or at least reduced to a significant degree by the application of a hermetic coating to the fiber surface after fiber drawing but before any polymeric coatings are applied. Hermetic coatings include metallic or nonmetallic coatings applied to the fiber surface by a variety of methods. For example, J. A. Wysocki U.S. Pat. No. 4,407,561 discloses that a variety of metals, including nickel, copper and aluminum may be used to provide a hermetic coating for a glass optical fiber. The metallic coating is applied by passing a just-drawn optical fiber through a molten pool of metal.

Hermetic coating techniques are typically employed during the drawing of the glass optical fiber from its precursor preform. The hermetic coating, the source of which is the products of reaction resulting from a reaction between a reactive gas and heat of a heated optical fiber, is applied immediately after drawing because the hermetic coatings must be applied adjacent to the glass fiber surface prior to the deposition of any polymeric coatings. It would be impractical to take up bare, glass fiber and, then, later apply the hermetic and polymeric coatings.

Because the purpose of applying a hermetic coating is, in part, to preserve the strength of the fiber to which it is applied, it is necessary that the pristine glass surface that results from the fiber drawing operation is not damaged before either the hermetic or the polymeric coatings are applied. Therefore, the optical fiber must not make any mechanical contacts with any portions of a hermetic coating apparatus through which the fiber moves. Any orifice portions the fiber is caused to move through must be sized and oriented such that fiber mechanical contact with those portions is avoided.

Typically, an entire preform will be drawn in a single draw episode. That episode will be shorter or longer depending on the size of the preform. With larger preforms come longer episode periods. During optical fiber drawing, internal portions of the hermetic coating apparatus are exposed to the heat of the fiber and become heated. These portions become hotter as the fiber drawing episode continues. They may become so hot that spontaneous reaction of the reactive gas occurs at the surface of these portions. The reaction causes products of reaction to be deposited on these surfaces and over time these products will accumulate and form what is referred to as secondary deposition deposits or soot.

Another potential source of soot is the reaction of the reactive gas that occurs away from the fiber outer surface yet within a reaction chamber of the hermetic coating apparatus. The resulting soot may remain suspended in the reactive gas flowing through the reaction chamber of the hermetic coating apparatus and then be expelled through a reaction chamber exhaust outlet or the soot may become attached to internal portions of the hermetic coating apparatus.

Soot deposits are particularly troublesome when the site of the deposition and accumulation occurs at fiber entry or exit orifices. Because these orifices are quite small in diameter, attenuation of the orifice diameter can occur quickly. When the effective orifice diameter becomes so small as to interfere with the fiber, fiber surface abrasion occurs.

What is needed and what does not appear to be provided in the prior art are methods of and apparatus for preventing the accumulation of reacted material on portions of a hermetic coating apparatus. Generally, the sought-after design should be one that does not compromise the integrity of the hermetic coating apparatus, is easy to use and allows for extended draw run periods.

SUMMARY OF THE INVENTION

The foregoing problem of accumulations of a soot on portions of a hermetic coating apparatus have been overcome with the hermetic coating methods and apparatus of this invention.

During the drawing of an optical fiber, an end portion of a suspended preform is heated and a glass optical fiber is pulled therefrom. The fiber is caused to be moved through a hermetic coating apparatus, a polymeric coating device and a polymeric coating curing unit and is taken up on a spool.

As the fiber passes through the hermetic coating apparatus, the residual heat of the fiber is sufficient to cause a reaction at the surface of the fiber with a gas, for example, acetylene gas, which is circulated through the hermetic coating apparatus. This results in the direct deposition of a layer of amorphous carbon on the fiber surface. The coating of amorphous carbon is a hermetic coating and is effective to prevent or reduce the exposure of the fiber surface to water vapor, hydroxyl ions and hydrogen.

The problem of soot deposits is overcome by the present invention wherein a cross-flow of an inert gas is maintained adjacent to surfaces vulnerable to soot deposits. In a preferred embodiment, the cross-flow gas is effective to cause the reactive gas and suspended soot to be expelled from the coating deposition chamber through an exhaust outlet before the reactive gas and suspended soot can come in contact with surfaces vulnerable to soot deposits.

The fiber, now with a hermetic coating disposed about its outer diameter, passes into a polymer coating device where one or more polymer coatings are applied to the fiber. The polymeric coatings are cured in an adjacent curing device, for example, an ultraviolet curing irradiator.

The fiber is taken up on a spool to complete the fiber drawing process.

BRIEF DESCRIPTION OF THE DRAWING

Other features of the present invention will be more readily understood from the following detailed description of specific embodiments thereof when read in conjunction with the accompanying drawings, in which.

DETAILED DESCRIPTION

Figure 1:
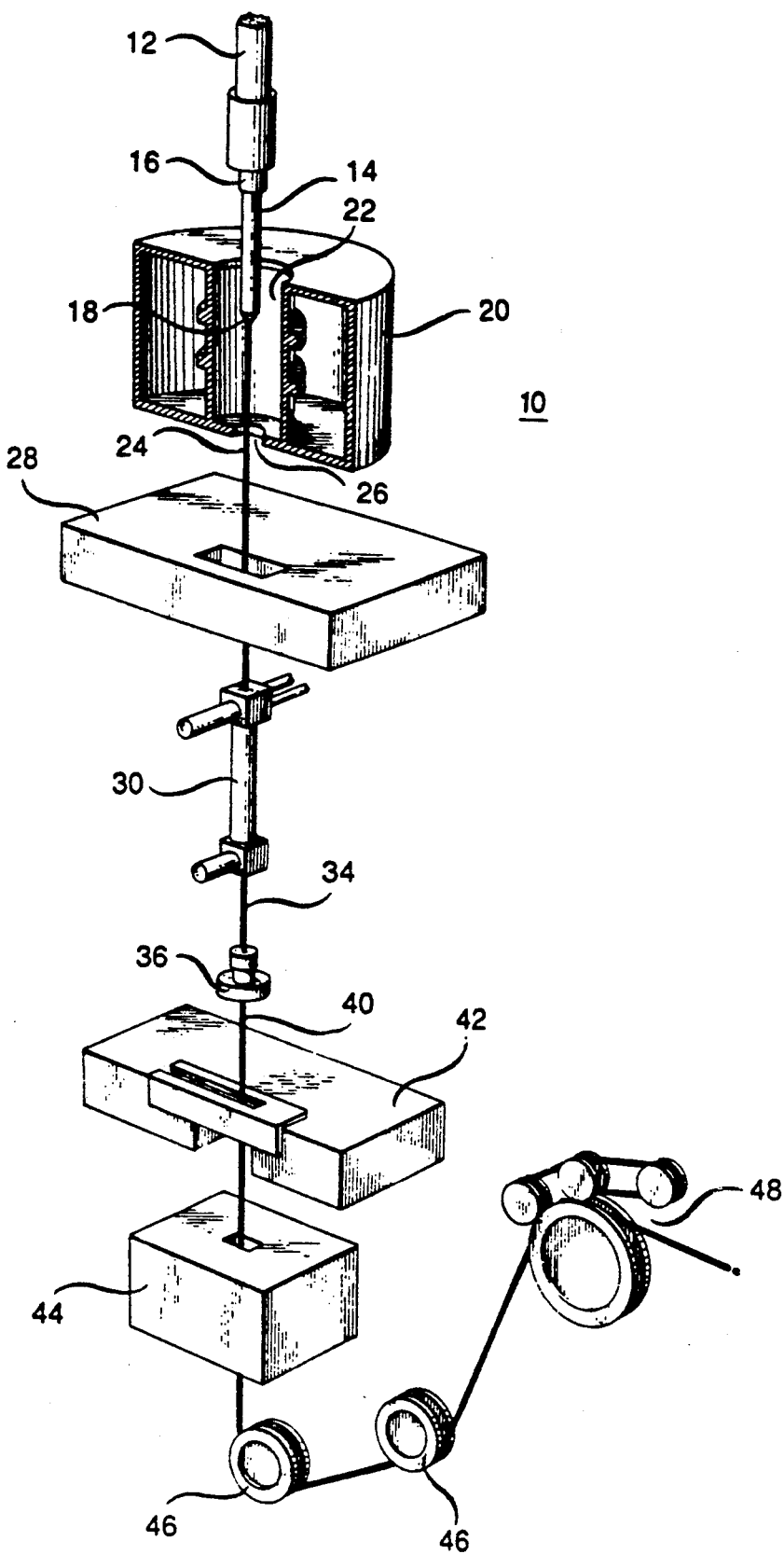
FIG. 1 is a perspective view of an optical fiber draw arrangement.
Figure 2:
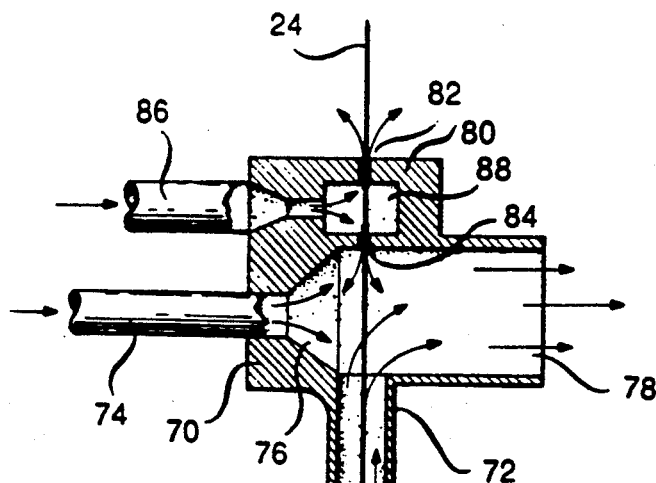
FIG. 2 is a cross-sectional view of a coating apparatus of this invention.

Referring now to FIG. 1, there is shown an optical fiber drawing system which is designated generally by the numeral 10. As can be seen in the drawing, the drawing system 10 includes a preform feed mechanism 12 which is effective to support an optical fiber preform 14 at a handle end 16 and cause a tip end 18 of the preform 14 to be fed into a drawing furnace 20 at a predetermined rate. The tip end 18 of the preform 14 is positioned in a hot zone 22 of the drawing furnace 20 and heated to a predetermined temperature. A fiber 24 is drawn from the preform tip 18 and moves through an aperture 26 of the furnace 20. The fiber 24 moves past a fiber diameter control device 28 which is effective to control a diameter of the optical fiber. The optical fiber moves also through a hermetic coating apparatus 30 wherein a hermetic coating material 32 (see FIG. 2) is applied to the fiber to provide a hermetic coated fiber 34. The hermetic coated fiber 34 is then moved through a coating apparatus 36 wherein the hermetic coated fiber 34 is caused to receive one or more polymer coatings 38-38 to provide a polymer coated fiber 40. The polymer coated fiber 40 is moved through a polymeric coating concentricity monitor 42, useful for maintaining a concentric disposal of the polymer coatings about the fiber 34, and then through a polymer curing device 44, for example, an ultraviolet irradiator. The fiber is then moved past and deflected by a plurality of rollers 46-46 and continues through a capstan mechanism 48 which is effective to apply a pulling force to the fiber to cause the fiber to be drawn from the tip 18 of the preform 14 and through the devices described above. The coated fiber 40 is taken up on a spool (not shown).

Figure 3:
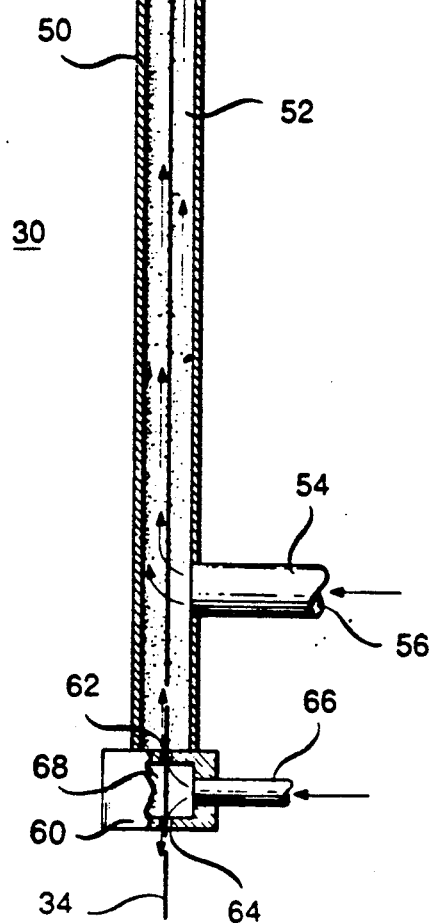
FIG. 3 is a perspective view of an optical fiber with hermetic and polymer coatings.

Looking now at FIG. 3, there is shown the hermetic coating apparatus of this invention which is designated generally by the numeral 30. As described hereinbefore, the hermetic coating device is located between the fiber diameter control device 28 and the polymer coating apparatus 36. The hermetic coating apparatus 30 comprises a coating deposition chamber 50 having a longitudinally extending bore 52. Attached to one end of the coating deposition chamber is a reactant gas inlet 54 having a bore 56 that communicates with the coating deposition chamber bore 52.

Attached to a fiber entry end of the coating deposition chamber 50 is a cross-flow manifold 70. The cross-flow manifold 70 comprises a transition portion 72 which communicates with the bore 52 of the coating deposition chamber 50, a cross-flow gas inlet to 74, a frustoconical gas flow diverging portion 76 and an exhaust outlet portion 78.

A fiber entry plenum 80 is disposed adjacent to the cross-flow manifold 70 of the coating deposition chamber 50. The fiber entry plenum comprises an entry orifice 82 and an exit orifice 84 spaced from the entry orifice 82 which communicates with the exhaust outlet portion 78. Also, the entry plenum 80 includes a purge gas inlet 86 which communicates with a chamber 88 of the fiber entry plenum 80.

A fiber exit plenum 60 is disposed adjacent to the reactant gas inlet 54 of the coating deposition chamber 50. The fiber exit plenum 60 comprises an entry orifice 62, an exit orifice 64 spaced from the entry orifice 62 and an exit plenum purge gas inlet 66 which communicates with a chamber 68 of the fiber exit plenum 60.

A fiber drawing process is initiated by suspending a preform 14 in the preform feed mechanism 12 and lowering the tip 18 into the furnace 20 such that the preform is heated in the hot zone 22. The fiber 24 is drawn from the tip of the preform and extended first through the fiber entry plenum 80 by threading the fiber 24 through the entry and exit orifices 82 and 84, respectively, of the entry plenum 80, then through the cross-flow manifold 70 and through the bore 52 of the coating deposition chamber 50. The fiber 24 is then extended through the fiber exit plenum 60 by threading the fiber 24 through the exit plenum entry and exit orifices 62 and 64, respectively. From the exit plenum 60, the fiber 24 is then threaded through the polymer coating die 36, the coating concentricity monitor 42 and the polymer curing device 44. The fiber is then disposed around the rollers 46—46 and into the fiber capstan mechanism 48.

The hermetic coating apparatus 30 is aligned precisely about the fiber 24 in such a manner that there is no contact of any portion thereof, for example, surfaces defining any of the entry or exit orifices 82, 84, 62 or 64, with the fiber 24 being drawn. This is extremely important since any contact of the hermetic coating device with a pristine fiber surface would most probably damage and weaken the fiber obviating any potentially beneficial effect of the hermetic coating or the polymeric coatings.

After the fiber has been extended through the hermetic coating apparatus 30 and is being drawn uninterruptedly by the drawing mechanism 48, the hermetic coating application is commenced first by establishing purge gas flows. A purge gas, for example, nitrogen, is introduced into the fiber entry plenum 80 through the purge gas inlet 86 and fills the chamber 88 between the entry and exit orifices 82 and 84. The purge gas escapes through annulli created between the entry orifice 82 and the fiber 24 moving therethrough and between the exit orifice 84 and the fiber.

A purge gas flow into the exit plenum 60 is also established. The exit plenum purge gas enters the exit plenum via the exit plenum purge gas inlet 66 and fills the chamber 68 between the entry orifice 62 and the exit orifice 64.

A cross-flow purge gas is introduced into the cross-flow manifold 70 through the cross-flow gas entry port 74. As the gas emerges from the entry port and encounters the frustoconical portion 76, the cross-sectional area of the gas flow increases with a concomitant decrease in flow velocity.

A reactant gas, for example, acetylene gas, is caused to enter the coating deposition chamber through the reactant gas inlet 54. The reactant gas then flows along the bore 52 of the coating deposition chamber and, in a preferred embodiment, the reactant gas flows in a direction opposite the movement of the fiber 24.

The fiber 24 entering the hermetic coating apparatus is at an elevated temperature due to the heating of the fiber in the furnace 20. The temperature of the fiber in the coating deposition chamber is a function of, among other things, the initial temperature of the fiber in the furnace hot zone 22, the speed at which the fiber 24 is being drawn, the diameter of the fiber, the position of the hermetic coating device relative to the furnace aperture 26 and the influence of heat transfer including conduction, convection and radiation. These variables are adjusted with respect to one another so that the temperature of the fiber 24 falls within a predetermined temperature range, for instance between about 700° and 900° C. in the preferred embodiment. A particular range is preferred over another depending on the reactive gas used for the coating and a desired physical state of the material formed by reaction of the reactive gas and the heat of the fiber. For example, a non-diamond-like carbon coating may be achieved when the reactive gas is acetylene and the reaction temperature is held below 900° C. As the reactive gas comes in contact with the heated fiber, reaction products of the reactive gas are caused to be deposited on the outer surface of the fiber. This deposition of reactive products continues throughout the drawing episode.

The escape of purge gas through the annulus created between the fiber 24 and the entry orifice 82 acts to prevent substantially air, which forms a boundary layer adjacent to the fiber and which is adhered to the fiber, from being introduced into the entry plenum 80 as the fiber moves through the hermetic coating apparatus 30. This is important in that a film of air surrounding the fiber inside the coating deposition chamber would not allow a complete reaction of the reactive gas at the outer surface of the fiber, thus resulting in an undesirable coating or coating quality.

Purge gas escaping through the annulus created between the entry plenum exit orifice 84 and the fiber 24 is effective to prevent reactant gas from entering the entry plenum 80 from the coating deposition chamber 50. The gas escaping through that annulus also cooperates with the cross-flow purge gas to prevent reactant gas or suspended soot from contacting portions of the hermetic coating apparatus adjacent to the exit orifice 84 of the entry plenum 80 which become hot enough to react the reactive gas. The cross-flow purge gas engages the reactant gas flow as the reactant gas rises from a lower portion of the coating deposition chamber adjacent to the reactant gas inlet 54 to the opposite end of the deposition chamber adjacent to the cross-flow manifold 70. The velocity and momentum of the cross-flow gas are sufficient to overcome the velocity and momentum of the rising reactant gas such that the reactant gas and the cross-flow purge gases are vented out of the coating deposition chamber through the exhaust outlet 78 of the cross-flow manifold 70. Reactant gas and suspended soot are thus prevented from contacting portions of the hermetic coating device 30 adjacent to the exit orifice 84 of the entry plenum 80. Since neither the reactant gas nor the suspended soot contact these heated areas, there will be substantially no deposition of soot in those areas. As previously described, the escape of purge gas through the annular opening created between the fiber 24 and the exit orifice 84 of the entry plenum 80 is believed to cooperate with the cross-flow purge gas to prevent soot deposition adjacent to the surfaces that define the exit orifice 84.

Purge gas escaping through the annulus created between the now hermetic coated fiber 34 and the entry orifice 62 of the exit plenum 60 is effective to prevent reactant gas from entering the exit plenum 60 and therefore escaping from the coating deposition chamber 50. Purge gas escaping through the annulus created between the fiber 34 and the exit orifice 64 of the exit plenum 60 is effective to prevent external ambient air from entering the exit plenum 60.

It is to be understood that the above-described arrangements are simply illustrative of the invention. Other arrangements may be devised by those skilled in the art which will embody the principles of the invention and fall within the spirit and scope thereof.

We claim:

1. An apparatus for providing a coated optical fiber, said apparatus comprising:
   means for suspending an optical fiber preform having a core and a clad and a longitudinal axis;
   means for drawing a fiber from the preform, said means comprising a furnace to heat the preform;
   means for coating the drawn fiber to form a coated fiber, said means for coating said fiber comprising:
   (a) a coating deposition chamber having a longitudinally extending bore and a longitudinal axis and being adapted to have an optical fiber be moved therethrough;
   (b) an entry plenum being connected to one end of said coating deposition chamber and having an entry orifice and an exit orifice spaced from said entry orifice, said entry plenum being adapted to have an optical fiber which has been drawn from a preform extend through said entry orifice and said exit orifice into said coating deposition chamber;
   (c) means for introducing a purge gas into said entry plenum;
   (d) an exit plenum connected to an opposite end of said coating deposition chamber, said exit plenum having an entry orifice and an exit orifice spaced from said entry orifice and being adapted to have an optical fiber from said coating deposition chamber extend therethrough;

(e) means for introducing a purge gas into said exit plenum;

(f) means for introducing a reactive gas into said coating deposition chamber, the reactive gas reacting upon contacting the drawn optical fiber to provide a reaction product that coats the fiber and a suspended soot;

(g) means for providing a cross-flow gas into said coating deposition chamber adjacent to the exit orifice of said entry plenum and to a fiber entry end of said coating deposition chamber in a direction substantially perpendicular to a longitudinal axis of said coating deposition chamber, the entry and exit plenums, said means for providing a cross-flow gas and said coating disposition chamber being connected together such that the fiber is not exposed to external air, and the cross-flow gas being effective to prevent the accumulation of the soot comprising reaction products of said reactive gas adjacent to said exit orifice of said entry plenum; and (h) means for exhausting the purge gases, the reactive gas and the cross-flow gas wherein the reactive gas and suspended soot are exhausted with the cross-flow gas perpendicularly to the longitudinal axis of the coating deposition chamber; and means for taking up the coated fiber.

2. The apparatus of claim 1, wherein said entry plenum is adapted to receive a flow of pressurized purge gas, the pressure of the purge gas being effective to cause the purge gas to flow from within said entry plenum through said entry orifice thereof to prevent substantially the influx of air into said entry plenum, and said pressure of the purge gas further being effective to cause the purge gas to flow from within the entry plenum through said exit orifice of said entry plenum to cooperate with said cross-flow gas to prevent the accumulation of the soot adjacent to said exit orifice of said entry plenum.

3. The apparatus of claim 2, wherein said means for providing a cross-flow gas into said coating deposition chamber comprises a cross-flow manifold interposed between said exit orifice of said entry plenum and an entrance to said coating deposition chamber, said manifold including a frustoconical portion which converges to a gas supply entry port that is connected to a cross-flow gas supply conduit, said frustoconical portion being effective to disperse uniformly the cross-flow gas received through the gas supply entry port in a region of the coating deposition chamber adjacent to said exit orifice of said entry plenum.

4. The apparatus of claim 1, wherein said exit plenum is adapted to receive a flow of pressurized purge gas, the pressure of the purge gas being effective to cause the purge gas to flow from within said exit plenum through said entry orifice thereof to prevent substantially the flow of said reactant gas into said exit plenum, and said pressure of said purge gas being effective further to cause the pressurized gas to flow from within said exit plenum though said exit orifice of said exit plenum to prevent substantially the flow of air into said exit plenum.

5. The apparatus of claim 1, wherein said means for introducing a reactive gas comprises a gas supply connecting portion having a passageway therethrough, said passageway communicating with said bore of said coating deposition chamber and being adapted to receive connectively a gas supply conduit and being effective to cause the reactive gas to enter said coating deposition chamber adjacent to said exit plenum and flow through said bore of said coating deposition chamber in a direction substantially opposite to the movement of the fiber therein.

6. The apparatus of claim 1, wherein the entry orifice and the exit orifice of said entry plenum are coaxially aligned.

7. The apparatus of claim 1, wherein the entry orifice and the exit orifice of said exit plenum are coaxially aligned.

* * * * *